United States Patent [19]

Nakazaki et al.

[11] Patent Number: 4,839,261

[45] Date of Patent: Jun. 13, 1989

[54] PHOTOCURABLE LAMINATE

[75] Inventors: Nobuo Nakazaki; Hideo Ai; Manabu Miyao, all of Fuji, Japan

[73] Assignee: Asahi Kasei Kogyo Kabushiki Kaisha, Osaka, Japan

[21] Appl. No.: 96,479

[22] Filed: Sep. 15, 1987

[30] Foreign Application Priority Data

Sep. 29, 1986 [JP] Japan .................................. 61-231058
Jul. 7, 1987 [JP] Japan .................................. 62-169507
Jul. 7, 1987 [JP] Japan .................................. 62-169508

[51] Int. Cl.$^4$ ................ G03C 5/00; G03C 1/68; G03C 1/71; G03C 1/76
[52] U.S. Cl. .................... 430/313; 430/270; 430/271; 430/280; 430/281; 430/287; 430/296; 430/311; 522/116; 522/117; 522/120; 522/121; 522/125; 522/110; 522/109
[58] Field of Search ............... 430/280, 281, 287, 296, 430/313

[56] References Cited

U.S. PATENT DOCUMENTS 4,378,264 3/1983 Pilette et al. .................... 430/287
4,528,332 7/1985 Ai et al. .......................... 430/287

FOREIGN PATENT DOCUMENTS 20077 2/1981 Japan .
0165141 12/1981 Japan .
96525 6/1983 Japan .
0134233 7/1985 Japan .
031409 2/1986 Japan .
2163435 2/1986 United Kingdom .

Primary Examiner—Paul R. Michl
Assistant Examiner—C. D. RoDee

Attorney, Agent, or Firm—Birch, Stewart, Kolasch & Birch

[57] ABSTRACT

A process for forming electroless copper plating patterns comprising: (a) laminating a substrate with a photocurable laminate, (b) exposing said photocurable laminate to a high energy ray, (c) removing unexposed parts of the laminate, and (d) electrolessly plating a desired pat of the laminate with copper; wherein said photocurable layer comprises (a) 100 parts by weight of a compound having recurring units represented by the following formulae [A] and [B]

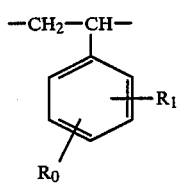

[A]

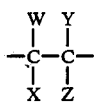

[B]

and (b) 5 to 1,000 parts by weight of a compound, which is compatible with compound (a), having a group represented by the formula

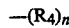

wherein $R_4$ is a group having a double bond and n is an integer of 1 to 50 and characterized by a viscosity at 20° C. of from 0.001 to 500 poises.

24 Claims, No Drawings

PHOTOCURABLE LAMINATE

FIELD OF THE INVENTION AND RELATED ART STATEMENT

1. Field of the Invention

The present invention relates to a novel photocurable laminate. More particularly, the present invention relates to a photocurable laminate having excellent characteristics particularly in acid resistance and alkali resistance and useful for the production of printed circuit boards or printing plates.

The substrate for permanent image formation which is referred to in the present invention is a substrate on which a resist image is to be formed and then a permanent image is to be formed by etching or plating using the resist image as a protective film, or a substrate on which said resist image itself is to become a permanent image. Specific examples of such a substrate are a copper-clad laminated sheet, a metal plate, a plastic film and an insulating sheet. The resist image is an image formed on a substrate as a result of photopolymerization of a photopolymerizable compound.

2. Related Art Statement

The current processes for the production of printed circuit boards are largely divided into the following three processes. They are a subtractive process wherein a resist image is formed on a copper-clad laminated sheet and then a desired circuit is formed by etching or the like using the resist image as a protective film; a full additive process wherein a resist image is formed on an insulating sheet and then chemical copper plating is applied to form a circuit; and a partly-additive process which is an intermediate process of the above two. Of these, the subtractive process is at present mainly used. However, in the technical trend of an increasing requirement for a substrate of higher density and higher reliability, the subtractive process is defective in that through-hole plating of high aspect ratio holes or of small diameter holes is difficult and the process steps require a long period of time and are complicated. Therefore, the partly-additive process and the full additive process are increasing drawing attention. Meanwhile, a variety of photocurable resist materials have been developed so as to be usable in each of the above processes. These materials have various characteristic requirements for use in printed circuit boards. Such characteristic requirements include not only lithography characteristics (sensitivity, resolution) but also heat resistance, mechanical strengths, acid resistance and alkali resistance. Particularly important are resistances to electroless copper plating, and especially, high alkali resistance.

The photocurable resists for the additive processes, particularly the dry film type photoresists for the partly-additive process do not have sufficient properties. That is, the during plating, these processes cause the mismatching or peeling between the substrate and resist image, do not allow the use of 1,1,1-trichloroethane as a developing solution and have low resolution. Accordingly, they are unsuitable for use as a photoresist.

OBJECT AND SUMMARY OF THE INVENTION

In view of the above technical situation and trend, an extensive study was made. As a result, it was found that a photocurable laminate which is superior in acid resistance, alkali resistance, heat resistance and mechanical strengths, can be removed by peeling with a solvent after completion of electroless copper plating. Further, because of its high alkali resistance, the photocurable laminate is particularly effective for use in a process for circuit formation by electroless copper plating. Based on these findings, the present invention has been completed.

An object of the present invention is to provide a photocurable laminate comprising a photocurable layer and a film-shaped substrate capable of substantially transmitting high-energy rays, characterized in that the photocurable layer contains, as essential components, (a) 100 parts by weight of a compound [hereinafter referred to as the compound (a)] having recurring units represented by the following formulae [A] and [B]

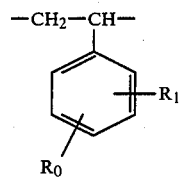 [A]

 [B]

wherein $R_0$ is a vinyl group, an epoxy group or an episulfide group; $R_1$ is a hydrogen atom, an alkyl group of 1 to 6 carbon atoms or a halogen atom; and $R_1$ and $R_0$ are attached to the position ortho, meta or para to the carbon atom of the main chain; and wherein W, X, Y and Z are each a hydrogen atom, a halogen atom, a cyano group, an alkyl group of 1 to 6 carbon atoms, a halogenated alkyl group of 1 to 6 carbon atoms, an aryl group of 6 to 30 carbon atoms substituted with alkyl or halogenated alkyl groups of 1 to 6 carbon atoms, an aryl group of 6 to 30 carbon atoms substituted with silicon-containing groups, an aryl group of 6 to 30 carbon atoms, —$COOR_2$, —$COR_2$, —O—$COR_2$ ($R_2$ is an alkyl or halogenated alkyl group of 1 to 12 carbon atoms, an aryl group of 6 to 30 carbon atoms substituted with alkyl or halogenated alkyl groups of 1 to 6 carbon atoms, an aryl group of 6 to 30 carbon atoms substituted with silicon-containing groups, of an aryl group of 6 to 30 carbon atoms), a nitro group, a silicon-containing group, or a substituent having heterocyclic rings substituted with at least one $R_3$ is a hydrogen atom, a hydroxyl group, a carboxyl group, a halogen atom, a nitro group, an amino group, a cyano group, an alkyl or halogenated alkyl group of 1 to 6 carbon atoms, an aryl group of 6 to 30 carbon atoms or a silicon-containing group) and (b) 5 to 1,000 parts by weight of a compound [hereinafter referred to as the compound (b)], which is compatible with compound (a), having a group represented by the following formula

wherein $R_4$ is a group having a double bond and n is an integer of 1 to 50 and characterized by a viscosity at 20° C. of from 0.001 to 500 poises.

The substrate used in the photocurable laminate of the present invention transmits a substantial amount of high-energy rays.

Examples of the substrate transmitting high-energy rays include films or sheets made of polyethylene terephthalate, polyvinyl alcohol, polyvinyl chloride, vinyl chloride copolymer, polyvinylidene chloride, vinylidene chloride copolymer, polymethyl methacrylate, methyl methacrylate copolymer, polystyrene, polyacrylonitrile, styrene copolymer, polyamide, a cellulose derivative or the like.

The high-energy rays referred to herein are ultraviolet rays, far-ultraviolet rays, laser beams, etc., all capable of efficiently curing the photocurable layer of the present photocurable laminate. Soft X-rays, electron beams, etc., can also efficiently cure said layer.

DETAILED DESCRIPTION OF THE PREFERRED EMBODIMENTS

The number-average molecular weight of the compound (a) is ordinarily 3,000 to 1,000,000, but, in view of the sensitivity and resolution of the photocurable layer of the present invention, is preferably 5,000 to 500,000.

$R_1$ of formula [A] of compound (a) is a hydrogen atom, an alkyl group of 1 to 6 carbon atoms or a halogen atom and is preferably a hydrogen atom.

$R_0$ of formula [A] of compound (a) is a vinyl group, an epoxy group or an episulfide group. In selecting one of these groups, the reactivity of each of these functional groups as well as the properties of the resist image after photocuring should be considered. For example, when the photocurable layer is required to have good adhesion with the substrate, the epoxy group or the episulfide group is typically used, and when the photocurable layer is required to have high sensitivity and mechanical strength, the vinyl group is typically used.

$R_0$ of formula [A] is at a position ortho, meta or para to the carbon atom of the main chain but, from the standpoint of the sensitivity of the photocurable layer, is preferably at a position meta or para to the carbon atom of the main chain.

The recurring unit represented by formula [A] need not be of a single type but can be two or more different types of appropriate proportions. The use of two or more types allows the production of a resist material wherein the characteristics of each type are utilized and which has high overall properties.

W, X, Y and Z of the recurring unit represented by formula [B] of compound (a) are each a hydrogen atom, a halogen atom, a cyano group, an alkyl group of 1 to 6 carbon atoms, a halogenated alkyl group of 1 to 6 carbon atoms, an aryl group of 6 to 30 carbon atoms substituted with alkyl or halogenated alkyl groups of 1 to 6 carbon atoms, an aryl group of 6 to 30 carbon atoms substituted with silicon-containing groups, an aryl group of 6 to 30 carbon atoms, —$COOR_2$, —$COR_2$, —O—$COR_2$ ($R_2$ is an alkyl or halogenated alkyl group of 1 to 12 carbon atoms, an aryl group of 6 to 30 carbon atoms substituted with alkyl or halogenated alkyl groups of 1 to 6 carbon atoms, an aryl group of 6 to 30 carbon atoms substituted with silicon-containing groups, or an aryl group of 6 to 30 carbon atoms), a nitro group, a silicon-containing group, or a substituent having heterocyclic rings substituted with at least one $R_3$ ($R_3$ is a hydrogen atom, a hydroxy group, a carboxyl group, a halogen atom, a nitro group, an amino group, a cyano group, an alkyl or halogenated alkyl group of 1 to 6 carbon atoms, an aryl group of 6 to 30 carbon atoms or a silicon-containing group). Examples of these atoms or groups are illustrated below, however, these illustrations are not intended to be restrictive of the present invention.

Examples of the halogen atom are fluorine, chlorine, bromine and iodine. Examples of the alkyl group of 1 to 6 carbon atoms include a methyl group, an ethyl group, a butyl group, a hexyl group, an isopropyl group, a tert-butyl group, a cyclohexyl group, etc. Examples of the halogenated alkyl group of 1 to 6 carbon atoms include a chloromethyl group, a 2,2,2-trichloroethyl group, etc. As examples of the aryl group of 6 to 30 carbon atoms, there can be mentioned a substituted phenyl group, a substituted indenyl group, a substituted naphthyl group, a substituted azulenyl group, a substituted heptalenyl group, a substituted biphenylenyl group, a substituted as-indacenyl group, a substituted s-indacenyl group, a substituted acenaphthenyl group, a substituted fluorenyl group, a substituted phenathryl group, a substituted anthryl group, a substituted fluoroanthryl group, a substituted aceanthrylenyl group, a substituted triphenylenyl group, a substituted pyrenyl group, a substituted chrysenyl group, a substituted naphthacenyl group, a substituted picenyl group, a substituted perylenyl group, a substituted pentaphenyl group, a substituted pentacenyl group, a substituted tetraphenylenyl group, a substituted hexaphenyl group, a substituted rubicenyl group, a substituted coronenyl group, a substituted trinaphthylenyl group, a substituted heptaphenyl group, a substituted heptacenyl group and a substituted pyranthrenyl group. As the silicon-containing group, there can be mentioned the following groups (1) to (38).

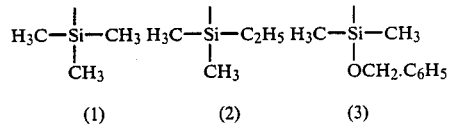

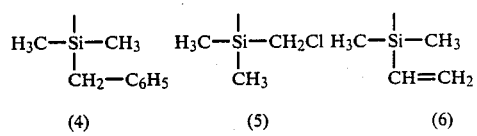

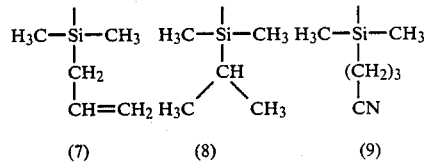

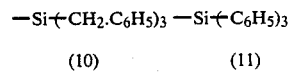

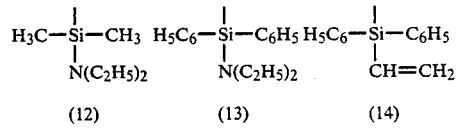

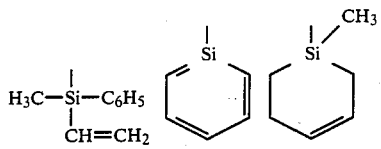
(15) (16) (17)
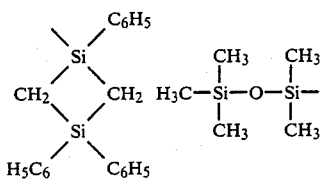
(18) (19)
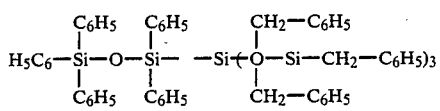
(20) (21)
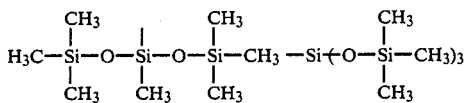
(22) (23)
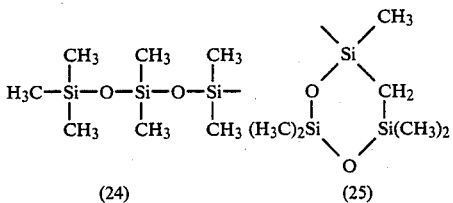
(24) (25)
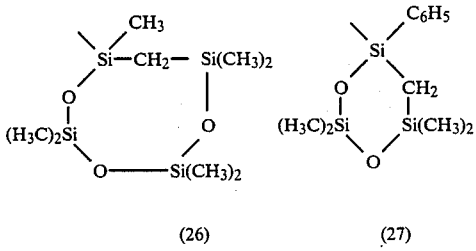
(26) (27)
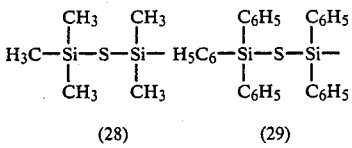
(28) (29)
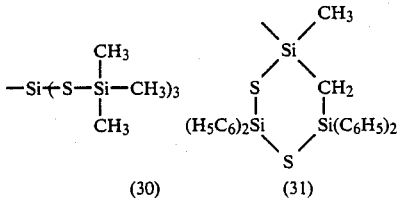
(30) (31)
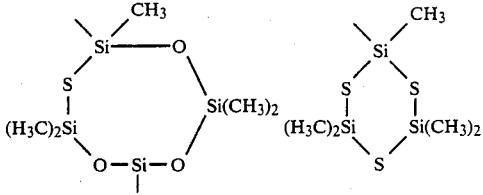
(32) (33)
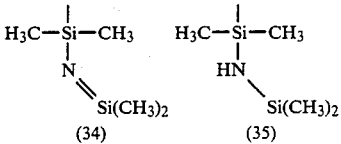
(34) (35)
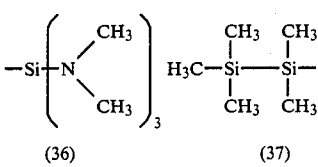
(36) (37)
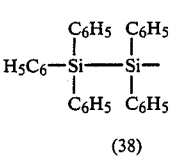
(38)
As examples of the substituent having heterocyclic rings substituted with at least one $R_3$, there can be mentioned groups having the following structural formulae (39) to (69).
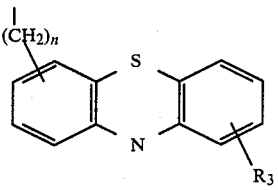
(39)
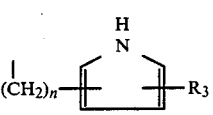
(40)
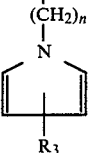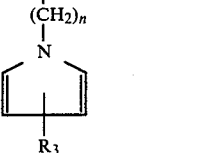
(41)
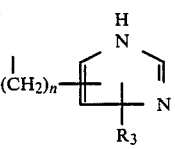
(42)

-continued
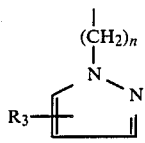 (43)
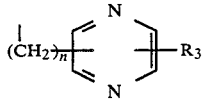 (44)
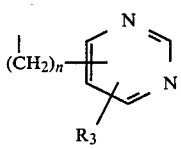 (45)
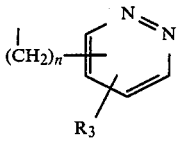 (46)
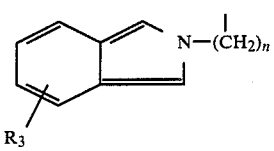 (47)
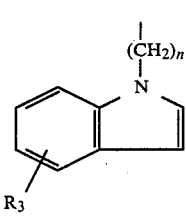 (48)
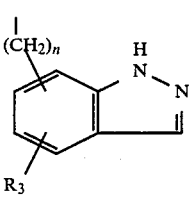 (49)
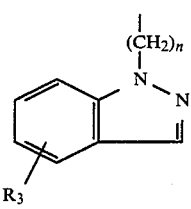 (50)
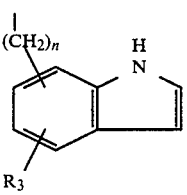 (51)
-continued
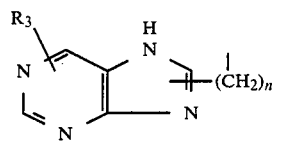 (52)
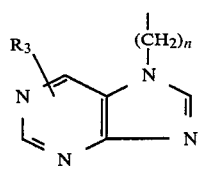 (53)
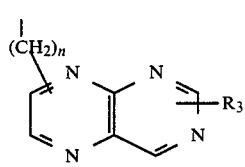 (54)
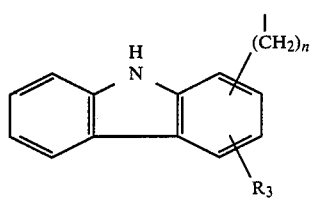 (55)
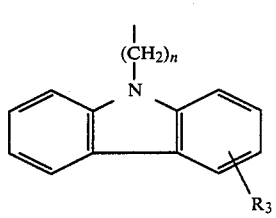 (56)
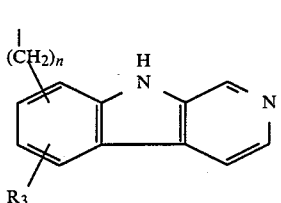 (57)
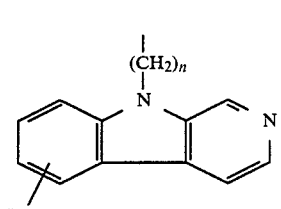 (58)
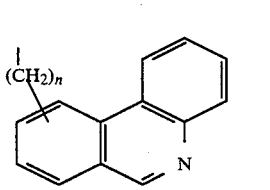 (59)

-continued

(60) 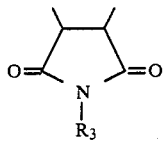

(61) 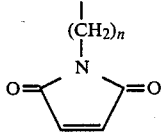

(wherein n is 0 or 1; $R_3$ is a hydrogen atom, a hydroxyl group, a carboxyl group, a halogen atom, a nitro group, an amino group, a cyano group, an alkyl group of 1 to 6 carbon atoms, a halogenated alkyl group of 1 to 6 carbon atoms, an aryl group of 6 to 30 carbon atoms or a silicon-containing group.)

Preferred examples of the combination of W, W, Y and Z when expressed in a form of (W,X,Y,Z) include (H,H,H,H), (H,H,H,$C_6H_5$), (H,H,H,$C_6H_4$—$C_2H_5$), (H,H,H,$C_{10}H_7$), (H,H,H,$C_{14}H_9$), (H,H,$CH_3$, $C_6H_5$), (H,$CH_3$,H,$C_6H_4$—Si($CH_3$)$_3$), (H,H,$C_6H_5$,$C_6H_5$), (($C_6H_5$, H,H,$C_6H_5$), ($C_6H_5$,H,H,$C_{10}H_7$), ($C_6H_5$,H,H,$C_{14}H_9$), ($C_{10}H_7$,H,H,$C_{10}H_7$), (H,H,H,$COOCH_3$), (H,H,H,$COOCF_3$), (H,H,$CH_3$,$COOCH_3$), (H,H,Cl,$COCH_3$), (H,H,H,CN), (H,H,H,$COOC_6H_5$), (H,H,H,

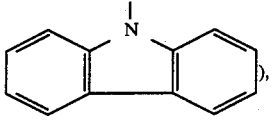

(H,H,H,

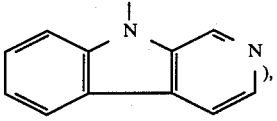

(H,H,H,Si($CH_3$)$_3$) and (H,H,H,Si($C_6H_5$)$_3$). Specific examples which are preferable from the chemical resistance include (H,H,H,H), (H,H,H,$C_6H_5$)), (H,H,H,$C_6H_4$—$C_2H_5$), (H,H,H,$C_{10}H_7$), (H,H,H,$C_{14}H_9$), (H,H,$CH_3$,$C_6H_5$), (H,$CH_3$,H,$C_6H_4$—Si($CH_3$)$_3$), (H,H,$C_6H_5$,$C_6H_5$), ($C_6H_5$,H,H,$C_6H_5$), ($C_6H_5$,H,H,$C_{10}H_7$), ($C_6H_5$,H,H,$C_{14}H_9$), ($C_{10}H_7$,H,H,$C_{10}H_7$), (H,H,H,

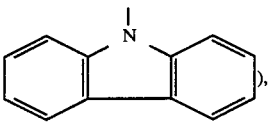

and (H,H,H,

(62) 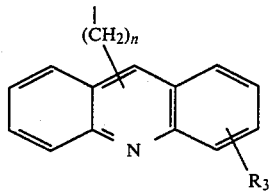

(63) 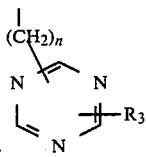

(64) 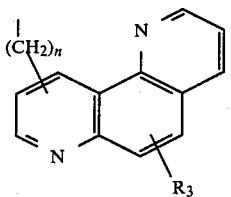

(65) 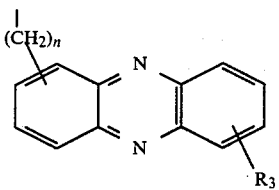

(66) 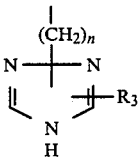

(67) 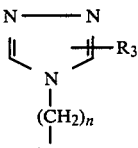

(68) 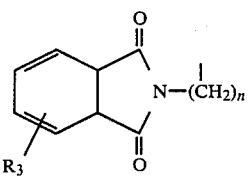

(69) 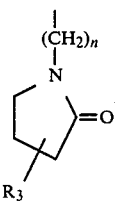

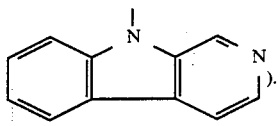

In these combinations, $C_{10}H_7$ and $C_{14}H_9$ denote a naphthyl group and an anthryl group, respectively. The combination of W, X, Y and Z is not restricted to these examples.

The recurring unit represented by the structural formula [B] need not be one type and can be two or more types of appropriate proportions or can additionally include other components, whereby the photocurable layer can have increased overall properties.

The mol fraction of the recurring unit represented by structural formula [A] of compound (a) is ordinarily 1 to 99% and, from the standpoint of the resolution and sensitivity of the photocurable layer, is preferably 5 to 95%.

Compound (a) of the present invention can be prepared by (1) copolymerizing a divinylbenzene as monomer [A] with a compound of the formula

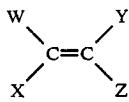

wherein W, X, Y and Z are the same as defined above, as the monomer [B] in the presence of butyl lithium and a dialkylamine when $R_0$ in formula [A] is a vinyl group to form a copolymer; (2) oxidizing the copolymer as obtained above (1) with a peracid when $R_0$ in formula [A] is an epoxy group; or (3) treating the copolymer as obtained above (1) with thiourea when $R_0$ in formula [A] is an episulfide group [See U.S. patent application Ser. No. 753,626 filed on July 10, 1985.].

Compound (b) of the present invention has a group represented by the following formula —(R$_4$)$_n$ (wherein $R_4$ is a group having a double bond and n is an integer of 1 to 50) and a viscosity at 20° C. of from 0.001 to 500 poises and is compatible with compound (a). From the viewpoint of compatibility of compound (b) with compound (a), those preferred are compounds in which n of formula —(R$_4$)$_n$ is 1 to 20.

Examples of compound (b) include alcohols and phenols in which the hydroxyl group is replaced by one of the groups represented by the following formulae;

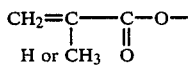 (i)

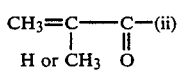 (ii)

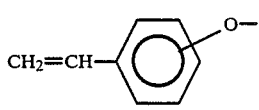 (iii)

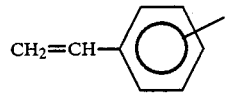 (iv)

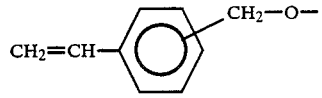 (v)

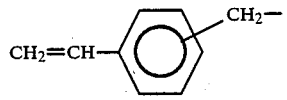 (vi)

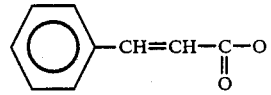 (vii)

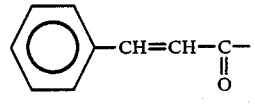 (viii)

$CH_2=CH-CH_2-O-$ (ix)
$CH_2=CH-CH_2-$ (x)

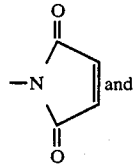 and (xi)

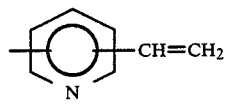 (xii)

Of these groups, from the viewpoint of the sensitivity of the photocurable layer, the ones preferred are groups (i) to (vi) and the ones more preferred are groups (i), (iii) and (v) from the viewpoint of ease of preparation.

Examples of alcohols include monohydric alcohols such as methanol, ethanol, isopropanol, butanol, cyclohexanol, benzyl alcohol, 2-ethyl-1-hexanol, 1-dodecanol, 2-(2-ethoxyethoxy)ethanol, 2-methoxyethanol, 2-ethoxyethanol and 2-butoxyethanol; polyhydric alcohols such as ethylene glycol, propylene glycol, butylene glycol, 1,5-pentanediol, 1,6-hexanediol, neopentyl glycol, polytetramethylene glycol, trimethylolpropanetriol, pentaerythritol, dipentaerythritol and polyvinyl alcohol; Examples of phenols include phenol, cresol, 2,2-bis((4-hydroxyphenyl)-propane and polyhydroxystyrene. Other examples of alcohol and phenol compounds are represented by the formula

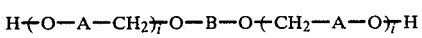 [J]

wherein

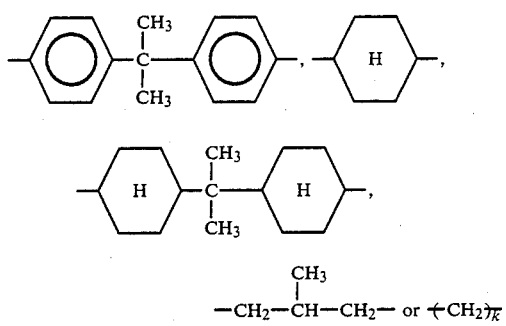

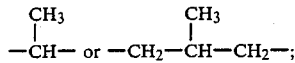

wherein k is an integer of 1 to 8.
B is —CH$_2$—, $$-\underset{\underset{CH_3}{|}}{CH}- \text{ or } -CH_2-\underset{\underset{CH_3}{|}}{CH}-CH_2-;$$

and i is an integer of 1 to 4.

Of these alcohols and phenols, from the viewpoint of the resolution of the photocurable layer the ones preferred are cyclohexanol, benzyl alcohol, 2-ethyl-1-hexanol, ethylene glycol, propylene glycol, butylene glycol, 1,5-pentanediol, 1,6-hexanediol, neopentyl glycol, polytetramethylene glycol, trimethylolpropanetriol, pentaerythritol, dipentaerythritol, polyvinyl alcohol, 2,2-bis(4-hydroxyphenyl)propane, polyhydroxystyrene and the compounds represented by formula [J] as described above.

Exemplary compounds of (b) include cinnamic acid esters, N-phenylmaleimide, trimethylolpropane triacrylate, pentaerythritol triacrylate, pentaerythritol tetraacrylate, dipentaerythritol hexaacrylate, dipentaerythritol pentaacrylate, dipentaerythritol tetraacrylate, dipentaerythritol triacrylate, polyesters of a dicarboxylic acid and a diol or a triol, acrylic acid esters such as tris(hydroxyethyl)triazine acrylate, corresponding methacrylic acid esters, monoacrylates such as ethyl acrylate, isopropyl acrylate, butyl acrylate, cyclohexyl acrylate, benzyl acrylate, 2-ethylhexyl acrylate, lauryl acrylate, carbitol acrylate, ethoxy acrylate, methoxypolyethyleneglycol acrylate, 2-hydroxyethyl acrylate, 2-hydroxypropyl acrylate, 2-hydroxy-3-chloropropyl acrylate, 1,4-butyleneglycol monoacrylate, dimethylaminoethyl acrylate, diethylaminoethyl acrylate, tetrahydrofuryl acrylate, 2-chloroethyl acrylate, 2,3-dibromopropyl acrylate, tribromophenyl acrylate, allyl acrylate, oleyl acrylate; acrylic acid or methacrylic acid esters of diols such as pentanediol, hexanediol, ethylene glycol, tetraethylene glycol, nonaethylene glycol, polyethylene glycol, neopentanediol, polypropylene glycol, neopentanediol ester of adipic acid; diacrylates or dimethacrylates represented by the formula (I)

$$CH_2=\underset{\underset{X_2}{|}}{C}-\underset{\underset{O}{||}}{C}-O-CH_2-\underset{\underset{OH}{|}}{CH}-CH_2-O-X_1-O-CH_2-\underset{\underset{OH}{|}}{CH}-CH_2-O-\underset{\underset{O}{||}}{C}-\underset{\underset{X_2}{|}}{C}=CH_2 \qquad (I)$$

[wherein X is

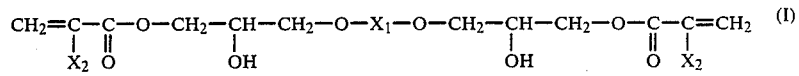

(n is an integer of 1 to 8) and X$_2$ is —H or —CH$_3$]; diacrylates or dimethacrylates represented by the formula (II)

$$CH_2=\underset{\underset{X_2}{|}}{C}-\underset{\underset{O}{||}}{C}+O-Y_1-CH_2\underset{\overline{n}}{)}O-\underset{}{\bigcirc}-\underset{\underset{CH_3}{|}}{\overset{\overset{CH_3}{|}}{C}}-\underset{}{\bigcirc}-O(CH_2-Y_1-O)_{\overline{n}}\underset{\underset{O}{||}}{C}-\underset{\underset{X_2}{|}}{C}=CH_2 \qquad (II)$$

[wherein Y$_1$ is —CH$_2$—, $$-\underset{\underset{CH_3}{|}}{CH}- \text{ or } -CH_2-\underset{\underset{OH}{|}}{CH}-;$$

X$_2$ is —H or —CH$_3$—; n is an integer of 1 to 4]; compounds represented by the formula (III);

$$H_2C=CH-\underset{}{\bigcirc}-CH_2-O-CH_2-\underset{\underset{OH}{|}}{CH}-CH_2-O-X_1-O-CH_2-\underset{\underset{}{}}{CH}-CH_2-O-CH_2-\underset{}{\bigcirc}-CH=CH_2 \qquad (III)$$

[wherein X$_1$ is $-CH_2-\underset{\underset{CH_3}{|}}{CH}-$, $-\bigcirc-CH_2-\bigcirc-$, $-\bigcirc-\underset{\underset{CH_3}{|}}{\overset{\overset{CH_3}{|}}{C}}-\bigcirc-$, or —(CH$_2$)$_n$— (n is an integer of 1 to 8)]; compounds represented by the formula (IV)

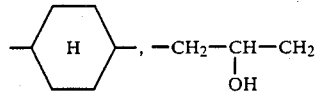

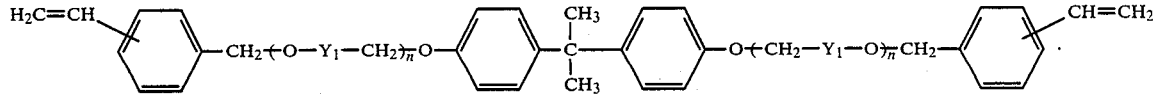
(IV)

[wherein Y is —CH$_2$—,

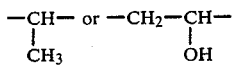

and n is an integer of 1 to 4]; acrylic acid addition products of epoxy resins, acrylonitrile, alpha-chloroacrylonitrile, vinylpyridine and vinylimidazole. However, compound (b) is not restricted to these compounds. For example, monomeric compounds having reactive functional groups such as, e.g., glycidyl methacrylate, styrene; multifunctional monomers having a styrene skeleton; and epoxy resins can be also used in the photocurable layer of the present invention.

From the standpoint of the compatibility with compound (a), the preferred compounds of (b) are trimethylolpropane triacrylate, pentaerythritol triacrylate, pentaerythritol tetraacrylate, dipentaerythritol hexaacrylate, dipentaerythritol pentaacrylate, dipentaerythritol tetraacrylate, dipentaerythritol triacrylate, the diacrylates and dimethacrylates represented by formulae (I) and (II), the compounds represented by formula (III) and the compounds represented by formula (IV).

The above compounds of (b) can be used singly or as a combination of two or more.

Compound (b) is typically used in an amount of from 5 to 1,000 parts by weight based on 100 parts by weight of compound (a). However, at least 10 parts by weight is preferred from the standpoint of the sensitivity of the photocurable layer of the present invention and 10 to 600 parts by weight is more preferred from the standpoint of the resolution of the photocurable layer.

It is preferred that a photopolymerization initiator or photosensitizer be added to the photocurable layer of the present photocurable laminate in order to shorten the reaction time or photocuring time of said layer when said layer is exposed to high-energy rays such as laser beams, ultraviolet rays or far-ultraviolet rays. The amount of the photopolymerization initiator or photosensitizer added is up to 50 parts by weight, preferably 0.01 to 30 parts by weight based on 100 parts by weight of compound (a).

As the photopolymerization initiator or photosensitizer usable in the present invention, there can be mentioned, for example, polynuclear quinones (e.g. benzoin, benzoin alkyl ethers, antrhaquinone), benzophenone, chlorobenzophenone, Michler's ketone, fluorine, thioxanthone, dialkylthioxanthones, halogenated thioxanthones, naphthalenesulfonyl chloride, azobisisobutyronitrile, 1-azobis-1-cyclohexanecarbonitrile, 2,4-dichlorobenzoyl peroxide, diphenyl disulfide, dibenzothiazole, 1-(4-isopropylphenyl)-2-hydroxy-2-methylpropane-1-one, 2-hydroxy-2-methyl-1-phenylpropane-1-one, dyes (e.g. erythrosine), electron-donating substances, triethylamine, p-aminobenzoic acid esters, triphenylphosphine and 2,2-dimethoxy-2-phenylacetophenone. Further, photo-induced ionic polymerization initiators are also effective. The photo-induced ionic polymerization initiators referred to herein are compounds which produce a Lewis acid or a Brønsted acid according to a photoreaction.

Furthermore, acylphosphine compounds are effective for increasing the resolution of the photocurable layer by preventing the exposed portions from swelling at the time when the unexposed portions is dissolved.

Examples of such acylphosphine compounds include 2,6-dimethylbenzoylphosphinic acid methyl ester,
2,6-dimethoxybenzoylphenylphosphinic acid methyl ester,
2,6-dimethylbenzoyldiphenylphosphine oxide,
2,6-dimethoxybenzoyldiphenylphosphine oxide,
2,4,6-trimethylbenzoylphenylphosphinic acid methyl ester,
2,4,6-trimethylbenzoyldiphenylphosphine oxide,
2,3,6-trimethylbenzoyldiphenylphosphine oxide,
2,4,6-trimethylbenzoyltolylphosphinic acid methyl ester,
2,4,6-trimethoxybenzoyldiphenylphosphine oxide,
2,6-dichlorobenzoylphenylphosphine ethyl ester,
2,6-dichlorobenzoyldiphenylphosphine oxide,
2-chloro-6-chloromethylthiobenzoyldiphenylphosphine oxide,
2,6-dimethylthiobenzoyldiphenylphosphine oxide,
2,3,4,6-tetramethylbenzoyldiphenylphosphine oxide,
2-phenyl-6-methylbenzoyldiphenylphosphine oxide,
2,6-dibromobenzoyldiphenylphosphine oxide,
2,4,6-trimethylbenzoylnaphthylphosphinic acid ether ester,
2,6-dichlorobenzoylnaphthylphosphinic acid ether ester,
1,3-dimethylnaphthalene-2-carbonylphenylphosphine oxide,
2,8-dimethylnaphthalene-1-carbonyldiphenylphosphine oxide,
1,3-dimethoxynaphthalene-2-carbonyldiphenylphosphine oxide,
1,3-dichloronaphthalene-2-carbonyldiphenylphosphine oxide,
2,4,6-trimethylpyridine-3-carbonyldiphenylphosphine oxide,
2,4-dimethylquinoline-3-carbonyldiphenylphosphine oxide,
2,4-dimethylfuran-3-carbonyldiphenylphosphine oxide,
2,4-dimethoxyfuran-3-carbonyldiphenylphosphine oxide, 2,4,5-trimethylthiophene-3-carbonylphenylphosphonic acid methyl ester and 2,4,5-trimethylthiophene-3-carbonyldiphenylphosphine oxide.

These photoionic polymerization initiators or photosensitizers can be used singly or as a combination of two or more.

Depending upon the required properties for the resist image formed by photocuring of the photocurable layer of the present invention, the photocurable layer can optionally contain a thermoplastic resin [hereinafter referred to as compound (c)].

Compound (c) is desired to be compatible with compounds (a) and (b). There can be mentioned, for example, vinyl polymers such as polymethyl methacrylate, methyl methacrylate copolymer, polystyrene, styrene copolymer, polyvinyl chloride, vinyl chloride copolymer, polyvinyl acetate, vinyl acetate copolymer and polyvinyl alcohol, as well as cellulose derivatives and mixtures thereof.

The amount of compound (c) added varies depending on the required properties for the protective film formed by curing of the photocurable layer. But the amount is typically up to 1,000 parts by weight based on 100 parts by weight of compound (a); in particular, up to 500 parts by weight when the resist image is required to have hardness; and at least 500 parts by weight when the resist image is required to have properties derived from compound (c).

Furthermore, the photocurable layer of the present invention can contain, if necessary or required, additives such as a dye, a stabilizer, a plasticizer, the like and mixtures thereof.

The photocurable laminate can be prepared by forming a mixture comprising compounds (a) and (b), coating the mixture onto a film-shaped substrate capable of substantially transmitting high-energy rays and drying the coated substrate. If necessary or desired, a protective film is disposed on the surface of the photocurable laminate. Such films are plastic films including polyethylene terephthalate films, polypropylene films and polyethylene films. If necessary, the photocurable laminate of this invention can be taken up as a roll.

The thickness of the photocurable layer varies depending on the application of the photocurable laminate of the present invention. When the laminate is used for production of printed circuit boards, the thickness is 5 to 200 μm, preferably 5 to 120 μm. The less thick the layer, the higher the resolution of the photocurable layer.

The photocurable laminate of the present invention can be used as a photoresist material having good developability and accordingly high resolution and in which the photocured film thereof after light exposure, is superior in mechanical strength, adhesion with substrate, chemical resistance and plating resistance (particularly, alkali resistance). The photocurable laminate exhibits excellent properties in both the through-hole copper plating method and the solder through-hole method. Use of this photocurable laminate allows easy, simplified production of a printed circuit board of high density and high precision.

The photocurable laminate of the present invention is particularly effective in the process of circuit formation by electroless copper plating. In one preferred embodiment of circuit formation using the photocurable laminate of the present invention, said photocurable laminate is placed on a substrate such as a glass-epoxy substrate and a copper-clad glass-epoxy laminate sheet; high-energy rays are applied onto the photocurable laminate through a photomask having a desired pattern; the photocurable laminate is subjected to development; copper plating is applied with an electroless copper plating solution; the resist image formed on the substrate is removed by peeling with a solvent; thereby forming a desired circuit onto the substrate.

EXAMPLES

The specific embodiments of the present invention are illustrated below by way of Examples, however, these illustrations are not intended to be restrictive of the present invention Examples.

The details of the analytical apparatus and method used in the following Syntheses and Examples are as follows.

GPC (Gel Permeation Chromatography):
  An apparatus produced by Nihon Bunko.
  Pump: TWINCLE
  Column: A-803 and A-804 in series
  Measurement of number-average molecular weight using a standard polystyrene calibration curve.

NMR (nuclear magnetic resonance) spectrum:
  Measurement by NMR-GX 400 Type ET-NMR (400 MHz) of JOEL.

SYNTHETIC EXAMPLE 1

Synthesis of 4-vinylstyrene oxide

In a one-liter reactor equipped with a stirrer and a thermometer were placed 25 g of p-divinylbenzene, 40 g of sodium hydrogencarbonate and 400 ml of toluene. Thereto was dropwise added 100 g of a toluene solution containing 40% by weight of m-chloroperbenzoic acid at 5° C. with stirring. Stirring was continued for further 10 hours at 5° C. After completion of the reaction, the reaction mixture was washed with an aqueous sodium hydrogencarbonate solution and dried with anhydrous magnesium sulfate. The drying agent was removed by filtration and the filtrate was subjected to vacuum distillation to remove toluene. The residue was purified by distillation to obtain 65 g of 4-vinylstyrene oxide (1 Torr, 74° C.).

SYNTHETIC EXAMPLE 2

Synthesis of 4-vinylstyrene episulfide

In a one-liter flask equipped with a stirrer and a thermometer was placed 300 ml of methanol. Thereto was added 100 g of 4-vinylstyrene oxide. With keeping the flask inside temperature at 5° to 10° C., 35 g of thiourea was added slowly. The mixture was stirred for 72 hours. After completion of the reaction, methanol was removed by distillation. The concentrate was water-washed to obtain 60 g of 4-vinylstyrene eipsulfide. In the proton NMR spectrum of the product, 4, 1, 1, 1, 1 and 2 protons were observed at δ values of 7.2 to 7.5, 6.65, 5.76, 5.20, 3.95 to 4.15 and 2.8 to 3.0, respectively.

SYNTHESIS EXAMPLE 3

1-Methyl-1,2-diphenylethylene(α-methyl-β-phenylstyrene)

In a one-liter autoclave equipped with a stirrer were placed 10 mmol of α-methylstyrene, 1 mmol of palladium acetate [Pd(OAc)$_2$], 10 mmol of triethylamine, 50 ml of acetonitrile and 9.2 mmol of phenyl iodide. The mixture was stirred at 100° C. for 34 hours. The reaction mixture was cooled and then poured into an aqueous 10 weight % HCl solution. The insoluble was removed by filtration. The solvent, etc. were removed from the filtrate. The residue was purified using an alumina column. In the NMR spectrum of the product obtained, each proton was observed at δ values of 7.6 ppm

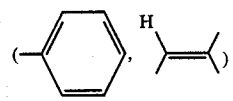

and 2.0 ppm (—CH₃).

SYNTHESIS EXAMPLE 4

In a one-liter separable flask equipped with a stirrer, a thermometer and a reflux condenser was placed 400 ml pf purified toluene. Thereto were added 60 g of the epoxy compound obtained in Synthetic Example 1 and 40 g of styrene, with stirring. Further, 0.8 g of α,α'-azobisisobutyronitrile was added. With keeping the flask inside temperature at 75° C., stirring was continued for 8 hours under a nitrogen current. After completion of the reaction, the reaction mixture was poured into a large amount of methanol and the whole mixture was allowed to stand for one night. The resulting white precipitate was collected by filtration, methanol-washed and vacuum-dried at room temperature to obtain 82 g of a copolymer. From GPC, the copolymer had a number-average molecular weight of 45,000.

It was found from the proton NMR spectrum that the copolymer contained 56 mole % of an epoxy compound.

SYNTHETIC EXAMPLES 5 TO 7

Copolymerization was conducted in the same manner as in Synthetic Example 4 except that the monomers as shown in Table 1 were used in place of styrene, whereby the copolymers as shown in Table 1 were obtained.

SYNTHETIC EXAMPLE 8

A two-liter flask equipped with a stirrer, a dropping funnel and a thermometer was purged with nitrogen. Therein were placed 500 ml of dried tetrahydrofuran and 200 g of diisopropylamine, and they were cooled to 0° C. Thereto was dropwise added 200 ml of a hexane solution containing 15% by weight of n-butyllithium, with stirring. To the mixture being kept at 9° C. was added 35 g of 2-vinylnaphthalene, and then a solution of 65 g of p-divinylbenzene dissolved in 200 ml of tetrahydrofuran was continuously added at a rate of 30 ml/hr. Stirring was continued for further 8 hours under a nitrogen current. 30 ml of methanol was added. The whole mixture was slowly poured into a large amount of methanol. The resulting white precipitate was collected by filtration, water-washed and dried to obtain 78 g of a white solid. This white solid was easily soluble in acetone, ethyl acetate, toluene, chloroform, etc. It had a number-average molecular weight of 32,000 when measured by GPC. Its NMR spectrum showed a broad absorption at around 0.8 to 3.0 (δ value) (a peak absorption at 1.5), a slightly pointed absorption each at 5.0 to 5.3 and 5.5 to 5.8, a broad absorption at 6.0 to 7.6 (a peak absorption each at 6.6 and 7.1).

The relative intensities of the above absorptions indicated that the white solid contained 80 mole % of divinylbenzene. Next, in a 100-ml of reactor equipped with a thermometer and a stirrer were placed 2.6 g of the compound obtained above, 30 ml of methylene chloride and 3.6 g of sodium hydrogencarbonate. They were cooled to 5° C. Thereto was dropwise added a solution of 8 g of m-chloroperbenzoic acid dissolved in 24 ml of methylene chloride with stirring. The mixture was stirred for 24 hours at 5° C. Complete consumption of m-chloroperbenzoic acid was confirmed with an iodine-starch paper, and then the reaction mixture was washed three times with a saturated aqueous sodium hydrogencarbonate solution and dried with anhydrous magnesium sulfate. The drying agent was removed by filtration and the filtrate was subjected to vacuum distillation to remove methylene chloride, whereby 2.4 g of a white powder was obtained. The white powder was easily soluble in organic solvents such as toluene, methyl ethyl ketone, ethyl acetate, chloroform and the like. The powder had a number-average molecular weight of 42,000 when measured by GPC. Its NMR spectrum showed a broad absorption at around 0.8 to 3.0 (δ value) (a peak absorption at 1.5), a slightly broad absorption each at 2.8, 3.1, 3.8, 5.2 and 5.7 and a broad absorption at 6.0 to 7.6 (a peak absorption each at 6.6 and 7.1).

SYNTHETIC EXAMPLE 9

A two-liter flask equipped with a stirrer, a dropping funnel and a thermometer was purged with nitrogen. Therein were placed 500 ml of dried tetrahydrofuran and 300 g of diisopropylamine, and they were cooled to 0° C. Thereto was dropwise added 190 ml of a hexane solution containing 15% by weight of n-butyllithium, with stirring. At 0° C., 40 g of 9-vinylanthracene was added and then a solution of 60 g of p-divinylbenzene dissolved in 200 ml of tetrahydrofuran was continuously added at a rate of 30 ml/hr. and stirring was continued for further 8 hours under a nitrogen current. Then 30 ml of methanol was added and the whole mixture was slowly added to a large amount of methanol. The resulting white precipitate was collected by filtration, water-washed and dried to obtain 52 g of a white solid. The white solid was easily soluble in acetone, ethyl acetate, toluene, chloroform, etc. It had a number-average molecular weight of 12,000 when measured by GPC. Its NMR spectrum showed a broad absorption at around 0.8 to 3.0 (δ value) (a peak absorption at 1.5), a slightly pointed absorption each at 5.0 to 5.3 and 5.5 to 5.8 and a broad absorption at 6.0 to 7.6 (a peak absorption each at 6.6 and 7.1).

The relative intensities of the above absorptions indicated that the white solid contained 80 mole % of divinylbenzene.

SYNTHETIC EXAMPLES 10 TO 12

Copolymers were obtained in the same manner as in Synthetic Example 9 except that the monomers as shown in Table 1 were used in place of 9-vinylanthracene.

SYNTHETIC EXAMPLE 13

Methanol/toluene (20/80 v/v) were placed in a one-liter flask equipped with a stirrer and a thermometer. Therein was dissolved 100 g of the copolymer obtained in Synthetic Example 4. At 5° to 10° C., 60 g of thiourea was added slowly, and the resulting mixture was stirred for 72 hours. After completion of the reaction, the resulting insoluble was removed by filtration. The filtrate was poured into a large amount of methanol. The resulting white precipitate was collected by filtration, water-washed and dried to obtain 46 g of a white solid. It had a number-average molecular weight of 78,000 when measured by GPC. Its NMR spectrum indicated that the white solid contained 42 mole % of epoxy group and 53 mole % of episulfide group.

SYNTHETIC EXAMPLE 14

400 ml of purified toluene was placed in a one-liter separable flask equipped with a stirrer, a thermometer and a reflux condenser. Thereto was added, with stirring, 40 g of the episulfide compound obtained in Synthetic Example 2 and 60 g of styrene. Further, 1 g of α,α'-azobisisobutyronitrile was added. Stirring was continued for 7 hours at 70° C. under a nitrogen current. After completion of the reaction, the reaction mixture was poured into a large amount of methanol, and the whole mixture was allowed to stand for one night. The resulting white precipitate was collected by filtration, methanol-washed and vacuum-dried at 20° C. to obtain 68 g of a copolymer. It had a number-average molecular weight of 23,000 by GPC.

From the proton NMR spectrum, the copolymer contained 38 mole % of an episulfide compound.

SYNTHETIC EXAMPLES 15 AND 16

Polymers were obtained in the same reaction and post-treatment as in Synthetic Example 14 except that the monomers as shown in Table 1 were used in place of styrene.

SYNTHETIC EXAMPLE 17

78 g of a copolymer was obtained in the same reaction and post-treatment as a Synthetic Example 4 except that 30 g of 3-vinylstyrene oxide as an epoxy compound and 70 g of styrene were used. The copolymer had a number-average molecular weight of 23,000 by GPC and, from the proton NMR spectrum, contained 25 mole % of epoxy group.

SYNTHETIC EXAMPLE 18

A copolymer was obtained in the same reaction and post-treatment as in Synthetic Example 9 except that commercially available divinylbenzene (50 weight %, ratio of m- and p-divinylbenzenes=75/25) was used in place of p-divinylbenzene. The copolymer had a number-average molecular weight of 31,000 by GPC.

TABLE 1

| Synthetic Example No. | Monomer [B] $\overset{H}{\underset{X}{\diagdown}}C=C\overset{Z}{\underset{Y}{\diagup}}$ | | | Monomer [A]*1/ Monomer [B] | $R_0$*2 in Monomer [A] | Mol % of Monomer [A] | Compound (a) Number average molecular weight | Designation of compound (a) |
|---|---|---|---|---|---|---|---|---|
| | X | Y | Z | | | | | |
| 4 | H | H | 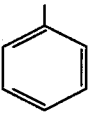 | 60/40 | E | 56 | 45,000 | a-1 |
| 5 | | 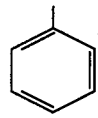 | H | 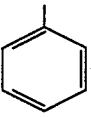 | 50/50 | E | 73 | 63,000 | a-2 |
| 6 | H | 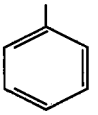 | 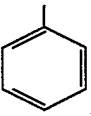 | 50/50 | E | 80 | 98,000 | a-3 |
| 7 | H | CH$_3$ | COOCH$_3$ | 40/60 | E | 50 | 120,000 | a-4 |
| 8 | H | H | 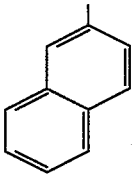 | 65/35 | E/V | 70/10 | 42,000 | a-5 |
| 9 | H | H | 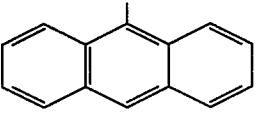 | 60/40 | V | 80 | 12,000 | a-6 |

TABLE 1-continued

| Synthetic Example No. | Monomer [B] X | Y | Z | Monomer [A]*1 / Monomer [B] | $R_0$*2 in Monomer [A] | Mol % of Monomer [A] | Compound (a) Number average molecular weight | Designation of compound (a) |
|---|---|---|---|---|---|---|---|---|
| 10 | H | H | 4-(CH$_2$—Si(CH$_3$)$_3$)-phenyl | 80/20 | V | 91 | 2,000 | a-7 |
| 11 | H | H | Si(C$_6$H$_5$)$_3$ | 5/95 | V | 10 | 9,000 | a-8 |
| 12 | H | H | 4-C$_2$H$_5$-phenyl | 10/90 | V | 20 | 165,000 | a-9 |
| 13 | H | H | phenyl | 60/40 | E/S | 42/53 | 78,000 | a-10 |
| 14 | H | H | phenyl | 40/60 | S | 38 | 23,000 | a-11 |
| 15 | H | H | carbazolyl | 10/90 | S | 7 | 21,000 | a-12 |
| 16 | phenyl | CH$_3$ | phenyl | 50/50 | S | 64 | 7,000 | a-13 |
| 17 | H | H | phenyl | 30/70 | E | 25 | 23,000 | a-14 |
| 18 | H | H | 9-anthryl | 60/40 | V | 72 | 10,000 | a-15 |

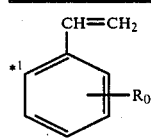

*1 styryl group with $R_0$ substituent on ring

*2 E: epoxy group, V: vinyl group, S: episulfide group

SYNTHETIC EXAMPLE 19

In a one-liter reactor equipped with a stirrer and a thermometer were placed 300 ml of dioxane and 50 g of polyethylene glycol having a molecular weight of about 300 and with stirring at 0° C. was slowly added 17 g of sodium hydride, and then stirring was continued for 3 hours at 20° C. Subsequently 65 g of 4-chloromethylstyrene was added to the mixture thus obtained and stirring was continued for 20 hours at 20° C. After completion of the reaction, dioxane was distilled off from the reaction mixture under reduced pressure and the remaining was purified by silica gel chromatography to give 38 g of a desired compound (b).

SYNTHETIC EXAMPLE 20

In a 2-liter reactor equipped with a stirrer and a thermometer were placed 600 ml of dioxane and 50 g of trimethylolpropanetriol and with stirring at 0° C. was slowly added 33 g of sodium hydride, and then stirring was continued for 3 hours at 20° C. Subsequently 205 g of 4-chloromethylstyrene was added to the mixture thus obtained and stirring was continued for 8 hours at 40° C. After completion of the reaction, dioxane was distilled off from the reaction mixture under reduced pressure and the remaining was purified by silica gel chromatography to give 150 g of a desired compound (b).

SYNTHETIC EXAMPLES 21 TO 23

In the same manner as in Synthetic Examples 19 and 20 were obtained 3 compounds (b) as shown in Table 2.

TABLE 2

| Synthetic Example No. | Compound (b) | |
|---|---|---|
| 19 | $X_0-O-(CH_2-CH_2-O)_n-X_0$ (n = 5~7) | b-7 |
| 20 | $CH_3-CH_2-C(CH_2-O-X_0)_3$ | b-8 |
| 21 | $X_0-O-(CH_2-CH_2-CH_2-CH_2-O)_m-X_0$ (m = 6~8) | b-9 |
| 22 | $X_0-O-\phi-C(CH_3)_2-\phi-O-X_0$ | b-10 |
| 23 | $X_0-(O-CH_2-CH_2)_2-\phi-C(CH_3)_2-\phi-O-(CH_2-CH_2-O)_2-X_0$ | b-11 |

Note:
$X_0$: 4-vinylbenzyl group

EXAMPLES 1 TO 16

In a one-liter separable flask equipped with a stirrer were placed a compound (a) (an essential component), a compound (b) (a photocurable compound and also an essential component), a compound (c) (a thermoplastic resin), at least one polymerization initiator, a solvent and, if necessary or required, a dye, at proportions shown in Table 3. They were stirred for 15 hours to prepare each mixture.

Each mixture was coated on a substrate, namely, a polyethylene terephthalate (PET) film of 38μ in thickness using a blade coater. The coated substrate was dried at 80° C. for 15 minutes in a hot air furnace. Each photocurable layer formed on the substrate had a thickness as shown in Table 3.

Each of the thus obtained photocurable laminates was press-bonded onto a copper-clad glass-epoxy laminated sheet using a pressure roll of 80° C. to allow the photocurable layer to closely adhere to the copper. Then, a light emitted from an ultra-high pressure mercury lamp (Model Phoenix 3000, manufactured by ORC Manufacturing Company) was applied to each laminate in an light amount as shown in Table 3 through a negative mask film. After peeling the PET film, using a spray nozzle 1,1,1-trichloroethane was sprayed on each laminate for a period of time as shown in Table 4 to dissolve and remove unexposed portions of the photocurable layer. The images thus obtained were all good.

Each substrate having thereon an image (100 μm square pattern=100×100) was subjected to an alkali resistance test, in which the substrate was immersed in an aqueous sodium hydroxide solution of pH 12 at 80° C. for 40 hours and then the percentage of the patterns remaining on the substrate was examined. The results are shown in Table 4.

COMPARATIVE EXAMPLES 1 AND 2

Using the mixtures having the following compositions, image formation and alkali resistance test were conducted in the same manner as in the above Examples. The results are shown in Table 4.

| Composition of Comparative Example 1 | |
|---|---|
| Polymethylmethacrylate*[1] | 200 g |
| Trimethylolpropane triacrylate | 220 g |
| Benzophenone | 8 g |
| Michler's ketone | 0.8 g |
| Dye "BLUE P"*[2] | 2 g |
| Methyl ethyl ketone | 300 g |
| Composition of Comparative Example 2 | |
| Polystyrene*[3] | 200 g |
| Trimethylolpropane triacrylate | 180 g |
| Benzophenone | 8 g |
| Michler's ketone | 0.8 g |
| Methyl ethyl ketone | 300 g |

*[1]"DELPET ® 70H", produced by Asahi Kasei Kogyo Kabushiki Kaisha
*[2]"Blue P", produced by Mitsubishi Kasei Kogyo Co., Ltd.
*[3]"STYRON ® GP 683", produced by Asahi Kasei Kogyo Kabushiki Kaisha

TABLE 3

| Example No. | Compound (a) (g) | Compound (b) (g) | Compound (c) (g) | Initiator (g) | Dye (g) | Solvent (g) | Thickness (μm) |
|---|---|---|---|---|---|---|---|
| 1 | a-5 (50) | b-1 (80) | — | I-3 (3) I-4 (0.3) | — | MEK (55) | 60 |
| 2 | a-1 (10) | b-3 (60) | c-1 (30) | I-1 (0.3) I-2 (2) | D-1 (0.1) | Toluene (125) | 25 |
| 3 | a-2 (80) | b-2 (20) | — | I-3 (9) I-4 (1) | D-2 (0.06) | MEK (110) Toluene (20) | 50 |
| 4 | a-3 (40) | b-1 (33) | — | I-10 (10) I-4 (2) | D-3 (0.07) | Ethyl acetate (135) | 100 |
| 5 | a-4 (10) | b-6 (56) | c-2 (100) | I-6 (5) I-7 (1) | — | Acetone (180) | 60 |

TABLE 3-continued

| Example No. | Compound (a) (g) | Compound (b) (g) | Compound (c) (g) | Initiator (g) | Dye (g) | Solvent (g) | Thickness (μm) |
|---|---|---|---|---|---|---|---|
| 6 | a-5 (90) | b-5 (23) | c-1 (10) | I-4 (2) I-5 (19) | Rose Bengal (0.03) | MEK (144) | 80 |
| 7 | a-6 (70) | b-4 (3) | | I-6 (30) | D-1 (0.01) | MEK (170) | 25 |
| 8 | a-7 (30) | b-1 (35) b-5 (80) | c-2 (15) | I-3 (0.1) I-4 (0.04) | — | Toluene (210) | 8 |
| 9 | a-8 (20) | b-3 (30) | c-2 (150) | I-3 (3) I-4 (0.07) I-6 (7) | — | Toluene (210) | 100 |
| 10 | a-9 (40) | b-2 (60) | c-3 (14) | I-1 (1) I-2 (4) | D-2 (0.02) | Acetone (110) | 80 |
| 11 | a-10 (50) | b-1 (30) | | I-5 (2) I-4 (0.3) | D-3 (0.05) | MEK (98) | 80 |
| 12 | a-11 (65) | b-1 (20) b-6 (10) | | I-1 (1) I-2 (1) I-6 (6) | — | Ethyl acetate (108) | 60 |
| 13 | a-12 (40) | b-3 (60) | c-1 (33) | I-3 (0.3) I-4 (0.05) I-6 (0.5) | — | Toluene (130) | 60 |
| 14 | a-13 (60) | b-4 (15) | c-3 (45) | I-3 (10) I-4 (1) | D-1 (0.03) | Acetone (145) | 25 |
| 15 | a-14 (95) | b-2 (20) | c-2 (7) | I-6 (6) I-7 (2) | — | MEK (150) | 25 |
| 16 | a-15 (20) | b-5 (60) | c-1 (120) | I-8 (0.5) I-9 (1.5) | D-4 (0.04) | MEK (250) | 10 |

Note:
Compound (b)
b-1: "ARONIX ® M-305" produced by Toa Gosei Kagaku Kogyo Co., Ltd. (main component: pentaerythritol triacrylate).
b-2: "D-330", produced by Nihon Kayaku Co., Ltd. (main component: dipentaerythritol triacrylate).
b-3: "EPOXYESTER 70 PA", produced by Kyoei Yushi Kagaku Kogyo Co., Ltd. (main component: propylene glycol diglycidyl ether - acrylic acid adduct).
b-4: "BISCOAT 3700", produced by Osaka Yushi Kagaku Kogyo Co., Ltd. (main component: bis(1,5-pentanediol)-phthalic anhydride - acrylic acid ester).
b-5: "EPOXYESTER BP-4PA", produced by Kyoei Yushi Kagaku Kogyo Co., Ltd.
b-6: "ARONIX ® 8100", produced by Toa Gosei Kagaku Kogyo Co., Ltd. (polyfunctional acrylic acid ester).
Compound (c)
c-1: "STYRON ® GP 683", produced by Asahi Kasei Kogyo Kabushiki Kaisha. (polystyrene)
c-2: "ASAFLEX ® AFX-800", produced by Asahi Kasei Kogyo Kabushiki Kaisha. (styrene-butadiene copolymer)
c-3: "ACRYPET ®", produced by Mitsubishi Rayon Co., Ltd. (polymethylmethacrylate)
Initiator
I-1: 2,4-Diisopropylthioxanthone
I-2: Isopropyl-4-(dimethylamino)benzoate
I-3: Benzophenone
I-4: 4,4'-Bis(dimethylamino)benzophenone (Michler's ketone)
I-5: Fluorine
I-6: Dimethylbenzyl ketal
I-7: Triphenyl phosphine
I-8: 4-Chlorothioxanthone
I-9: Ethyl 4-(dimethylamino)benzoate
I-10 4-Chlorobenzophenone
Dye
D-1: "Blue-P"
D-2: "Green-C"
D-3: "Blue-K"
D-4: "Blue-G" (All produced by Mitsubishi Kasei Kogyo Co., Ltd.)
Solvent
MEK: Methyl ethyl ketone

TABLE 4

| No. of Example or Comparative Example No. | Amount of light applied (mJ) | Time of development (sec.) | Percentage of remaining patterns (%)*1 |
|---|---|---|---|
| Example | | | |
| 1 | 200 | 30 | 99.99 |
| 2 | 60 | 80 | 100 |
| 3 | 80 | 45 | 100 |
| 4 | 120 | 60 | 100 |
| 5 | 80 | 60 | 98.00 |
| 6 | 100 | 50 | 100 |
| 7 | 60 | 30 | 100 |
| 8 | 30 | 20 | 100 |
| 9 | 100 | 60 | 99.98 |
| 10 | 80 | 60 | 100 |
| 11 | 90 | 60 | 100 |
| 12 | 60 | 50 | 100 |
| 13 | 60 | 50 | 100 |
| 14 | 40 | 40 | 100 |
| 15 | 40 | 40 | 100 |
| 16 | 30 | 30 | 100 |
| Comparative Example | | | |
| 1 | 60 | 80 | 0 |
| 2 | 60 | 50 | 56.80 |

*1 Percentage of remaining patterns = $\frac{\text{Number of patterns remaining in substrate}}{10,000} \times 100$

EXAMPLES 17 TO 25

In the same manner as in Examples 1 to 16 were prepared mixtures as shown in Table 5.

Each mixture was coated on a polyethylene terephthalate (PET) film of 38 μm in thickness as the substrate using a blade coater. The coated substrate was dried at 80° C. for 15 minutes in a hot air furnace. Each photocurable layer formed on the substrate had a thickness as shown in Table 5.

Each of the thus obtained photocurable laminates was press-bonded onto a copper-clad glass-epoxy laminated sheet using a pressure roll of 80° C. to allow the photocurable layer to closely adhere to the copper. Then, a light emitted from an ultra-high pressure mercury lamp (Model Phoenix 3000, manufactured by ORC Manufacturing Co., Ltd.) was applied to each laminate in a light amount as shown in Table 6 through a negative mask film. After peeling the PET film, using a spray nozzle 1,1,1-trichloroethane was sprayed on each laminate for a period of time as shown in Table 6 to dissolve and remove unexposed portions of the photocurable layer. The images thus obtained were all good.

Each substrate having thereon an image (100 μm square pattern=100×100) was subjected to an alkali resistance test where the substrate was immersed in an aqueous sodium hydroxide solution of pH 12 containing 0.15 mol/l of formalin at 80° C. for 80 hours and then the percentage of the patterns remaining on the substrate was examined. The results are shown in Table 6.

Also each mixture as described above was coated on a glass sheet using a blade coater, dried and exposed to the light in the same manner as described above except that the negative mask film was not used. As the result, a photocured layer of 80 μm in thickness was obtained on the glass sheet. Then the photocured layer was peeled from the glass sheet and immersed in 1,1,1-trichloroethane for 30 minutes and then the degree of swelling was examined in terms of the percentage of 1,1,1-trichloroethane contained in the photocured layer after removal of 1,1,1-trichloroethane-dissolved portion. The results are shown in Table 6.

COMPARATIVE EXAMPLES 3 AND 4

Using the mixtures having the same compositions as in Comparative Examples 1 and 2, alkali resistance and swelling tests were conducted in the same manner as in Examples 17 to 25. The results are shown in Table 6.

TABLE 6

| Example No. | Amount of Light Applied (mJ) | Time of Development (sec.) | Percentage of Remaining Patterns* (g) | Degree of Swelling** (g) |
|---|---|---|---|---|
| 17 | 200 | 60 | 100 | 30 |
| 18 | 180 | 60 | 100 | 35 |
| 19 | 260 | 80 | 98.00 | 21 |
| 20 | 80 | 80 | 98.56 | 15 |
| 21 | 120 | 60 | 100 | 10 |
| 22 | 100 | 50 | 100 | 25 |
| 23 | 220 | 60 | 100 | 25 |
| 24 | 140 | 30 | 100 | 30 |
| 25 | 90 | 30 | 98.98 | 20 |
| Comparative Example No. | | | | |
| 3 | 80 | 80 | 0 | 120 |
| 4 | 90 | 50 | 5.12 | 100 |

*Percentage of remaining patterns = $\frac{\text{Number of patterns remaining in substrate}}{10{,}000} \times 100$

**Degree of swelling = $\frac{\text{Weight (g) of 1,1,1-trichloroethane containing in photocurable layer after removal of dissolved portion}}{\text{Weight (g) of photocurable layer after removal of dissolved portion}} \times 100$

What is claimed is:

1. A process for forming electroless copper plating patterns comprising:
   (a) laminating a substrate with a photocurable laminate,
   (b) exposing said photocurable laminate to a high energy ray,
   (c) removing unexposed parts of the laminate, and
   (d) electrolessly plating a desired part of the laminate with copper;
   wherein said photocurable laminate comprises a photocurable layer and a film-shaped substrate capable of substantially transmitting high-energy rays, said photocurable layer comprises (a) 100 parts by weight of a compound having recurring units represented by the following formulae [A] and [B]

TABLE 5

| Example No. | Compound (a) (g) | Compound (b) (g) | Compound (c) (g) | Initiator (g) | Dye (g) | MEK*[1] as solvent (g) | Thickness (μm) |
|---|---|---|---|---|---|---|---|
| 17 | a-1 (100) | b-7 (20) b-8 (50) | c-1 (50) | I-3 (20) | D-1 (0.8) | 200 | 90 |
| 18 | a-1 (100) | b-11 (50) b-8 (10) | c-1 (100) | I-5 (10) I-6 (4) | — | 300 | 40 |
| 19 | a-1 (100) | b-9 (80) | c-2 (150) | I-2 (60) I-3 (10) I-6 (50) | D-2 (0.3) | 1200 | 80 |
| 20 | a-1 (100) | b-11 (80) b-10 (10) | c-3 (80) | I-11*[2] (0.2) | D-3 (0.1) | 300 | 60 |
| 21 | a-1 (100) | b-11 (60) b-7 (20) | c-1 (400) | I-11*[2] (30) | D-1 (0.4) | 600 | 20 |
| 22 | a-1 (100) | b-11 (100) b-8 (80) | c-2 (300) | I-7 (40) I-8 (90) | Rose Bengal (0.2) | 500 | 80 |
| 23 | a-1 (100) | b-7 (10) | — | I-1 (6) I-3 (8) | — | 100 | 50 |
| 24 | a-1 (100) | b-7 (90) | c-2 (100) | I-5 (30) I-7 (10) | D-1 (0.25) | 250 | 95 |
| 25 | a-1 (100) | b-9 (200) | c-1 (200) | I-12*[3] (5) | D-1 (0.2) | 500 | 80 |

*[1]MEK: methyl ethyl ketone
*[2]I-11: 2,6-dimethylbenzoyldiphenylphosphine oxide
*[3]I-12: 2,4,6-trimethylbenzoyldiphenylphosphine oxide

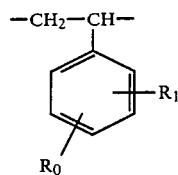  [A]

  [B]

wherein $R_0$ is a vinyl group, an epoxy group or an episulfide group; $R_1$ is a hydrogen atom, an alkyl group of 1 to 6 carbon atoms or a halogen atom; and $R_1$ and $R_0$ are attached to the position ortho, meta or para to the carbon atom of the main chain; and wherein W, X, Y and Z are each a hydrogen atom, a halogen atom, a cyano group, an alkyl group of 1 to 6 carbon atoms, a halogenated alkyl group of 1 to 6 carbon atoms, an aryl group of 6 to 30 carbon atoms substituted with alkyl or halogenated alkyl groups of 1 to 6 carbon atoms, an aryl group of 6 to 30 carbon atoms substituted with silicon-containing groups, an aryl group of 6 to 30 carbon atoms, —COOR$_2$, —COR$_2$, —O—COR$_2$ ($R_2$ is an alkyl or halogenated alkyl group of 1 to 12 carbon atoms, an aryl group of 6 to 30 carbon atoms substituted with alkyl or halogenated alkyl groups of 1 to 6 carbon atoms, an aryl group of 6 to 30 carbon atoms substituted with silicon-containing groups, or an aryl group of 6 to 30 carbon atoms), a nitro group, a silicon-containing group, or a substituent having heterocyclic rings substituted with at least one $R_3$ ($R_3$ is a hydrogen atom, a hydroxyl group, a carboxyl group, a halogen atom, a nitro group, an amino group, a cyano group, an alkyl or halogenated alkyl group of 1 to 6 carbon atoms, an aryl group of 6 to 30 carbon atoms or a silicon-containing group) and (b) 5 to 1,000 parts by weight of a compound, which is compatible with compound (a), having a group represented by the formula —(R$_4$)$_n$ wherein $R_4$ is a group having a double bond and n is an integer of 1 to 50 and characterized by a viscosity at 20° C. of from 0.001 to 500 poises.

2. The process for forming electroless copper plating patterns according to claim 1, wherein the film-shaped substrate is polyethylene terephthalate, polyvinyl alcohol, polyvinyl chloride, vinyl chloride copolymer, polymethyl methacrylate, methyl methacrylate copolymer, polystyrene, polyacrylonitrile, styrene copolymer, polyamide or a cellulose derivative.

3. The process for forming electroless copper plating patterns according to claim 1, wherein the high-energy rays are ultraviolet rays, far-ultraviolet rays, laser beams, soft X-rays or electron beams.

4. The process for forming electroless copper plating patterns according to claim 3, wherein the high-energy rays are ultraviolet rays, far-ultraviolet rays, or laser beams.

5. The process for forming electroless copper plating patterns according to claim 1, wherein compound (a) has a number-average molecular weight of 3,000 to 1,000,000.

6. The process for forming electroless copper plating patterns according to claim 5, wherein compound (a) has a number-average molecular weight of 5,000 to 500,000.

7. The process for forming electroless copper plating patterns according to claim 1, wherein $R_1$ is a hydrogen atom.

8. The process for forming electroless copper plating patterns according to claim 1, wherein $R_0$ and $R_1$ of formula [A] are each at a position of meta or para to the carbon atom of the main chain.

9. The process for forming electroless copper plating patterns according to claim 8, wherein $R_0$ of formula [A] is a vinyl group.

10. The process for forming electroless copper plating patterns according to claim 1, wherein the W of formula [B] is a hydrogen atom.

11. The process for forming electroless copper plating patterns according to claim 10, wherein the X, Y and Z of formula [B] are each a hydrogen atom, a cyano group, an alkyl group of 1 to 6 carbon atoms, a halogenated alkyl group of 1 to 6 carbon atoms, an aryl group of 6 to 30 carbon atoms substituted with alkyl or halogenated alkyl groups of 1 to 6 carbon atoms, an aryl group of 6 to 30 carbon atoms substituted with silicon-containing groups, an aryl group of 6 to 30 carbon atoms, —COOR$_2$, —COR$_2$, —O—COR$_2$ ($R_2$ is an alkyl or halogenated alkyl group of 1 to 12 carbon atoms, an aryl group of 6 to 30 carbon atoms substituted with alkyl or halogenated alkyl groups of 1 to 6 carbon atoms, an aryl group of 6 to 30 carbon atoms substituted with silicon-containing groups or an aryl group of 6 to 30 carbon atoms), a nitro group, a silicon-containing group or a substituent having heterocyclic rings substituted with at least one $R_3$ ($R_3$ is a hydrogen atom, a hydroxyl group, a carboxyl group, a halogen atom, a nitro group, an amino group, a cyano group, an alkyl or halogenated alkyl group of 1 to 6 carbon atoms, an aryl group of 6 to 30 carbon atoms or a silicon-containing group).

12. The process for forming electroless copper plating patterns according to claim 10, wherein the X, Y and Z of formula [B] are each a hydrogen atom, a halogen atom, a cyano group, an alkyl group of 1 to 6 carbon atoms, a halogenated alkyl group of 1 to 6 carbon atoms, an aryl group of 6 to 30 carbon atoms substituted with alkyl or halogenated alkyl groups of 1 to 6 carbon atoms, an aryl group of 6 to 30 carbon atoms substituted with silicon-containing groups, an aryl group of 6 to 30 carbon atoms, a nitro group, silicon-containing group, or a substituent having heterocyclic rings substituted with at least one $R_3$ ($R_3$ is a hydrogen atom, a halogen atom, a cyano group, an alkyl or halogenated alkyl group of 1 to 6 carbon atoms, an aryl group of 6 to 30 carbon atoms, or a silicon-containing group).

13. The process for forming electroless copper plating patterns according to claim 1, wherein the mol fraction of the recurring unit represented by formula [A], of compound (a) is 1 to 99%.

14. The process for forming electroless copper plating patterns according to claim 13, wherein the mol fraction of the recurring unit represented by formula [A], of compound (a) is 5 to 95%.

15. The process for forming electroless copper plating patterns according to claim 1, wherein $R_4$ of compound (b) is one of the groups represented by the formulae (i) 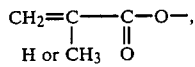

(ii) 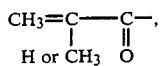

(iii) 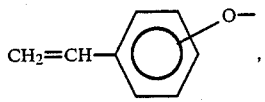

(iv) 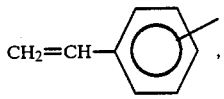

(v) 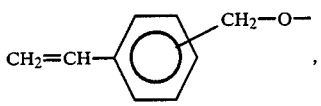

(vi) 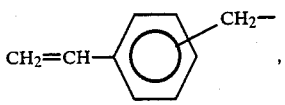

(vii) 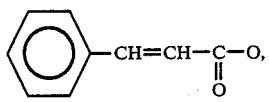

(viii) 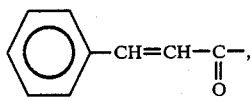

(ix) (x) 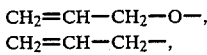

(xi) 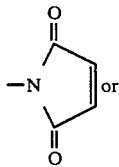

(xii) 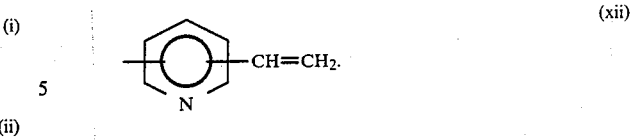

16. The process for forming electroless copper plating patterns according to claim 1, wherein the amount of compound (b) is 10 to 800 parts by weight based on 100 parts by weight of compound (a).

17. The process for forming electroless copper plating patterns according to claim 1, wherein said photocurable laminate contains up to 50 parts by weight based on 100 parts by weight of compound (a) of a photopolymerization initiator or photosensitizer.

18. The process for forming electroless copper plating patterns according to claim 1, wherein said photocurable laminate contains 0.01 to 30 parts by weight based on 100 parts by weight of compound (a) of a photopolymerization initiator or photosensitizer.

19. The process for forming electroless copper plating patterns according to claim 1, wherein said photocurable layer contains up to 1,000 parts by weight based on 100 parts by weight of compound (a) of compound (c), in which compound (c) is a thermoplastic resin which is compatible with compounds (a) and (b).

20. The process for forming electroless copper plating patterns according to claim 19, wherein said thermoplastic resin is polymethyl methacrylate, methyl methacrylate copolymer, polystyrene, styrene copolymer, polyvinyl chloride, vinyl chloride copolymer, polyvinyl acetate, vinyl acetate copolymer or polyvinyl alcohol.

21. The process for forming electroless copper plating patterns according to claim 1, wherein said photocurable laminate further contains an additive, said additive comprising a dye, a stabilizer, a plasticizer or mixtures thereof.

22. The process for forming electroless copper plating patterns according to claim 1, wherein a plastic protective film is disposed on the surface of the photocurable layer.

23. The process for forming electroless copper plating patterns according to claim 22, wherein the plastic protective film is a polyethylene terephthalate film, a polypropylene film or a polyethylene film.

24. The process for forming electroless copper plating patterns according to claim 1, wherein the substrate is a copper-clad, glass-epoxy laminated sheet.

* * * * *